US009252325B2

United States Patent
Mukono et al.

(10) Patent No.: US 9,252,325 B2
(45) Date of Patent: Feb. 2, 2016

(54) METHOD FOR PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventors: Misato Mukono, Kiyosu (JP); Ryo Nakamura, Kiyosu (JP)

(73) Assignee: TOYODA GOSEI CO., LTD., Kiyosu-Shi Aichi-Ken (JP)

( * ) Notice: Subject to any disclaimer, the term of this patent is extended or adjusted under 35 U.S.C. 154(b) by 83 days.

(21) Appl. No.: 14/093,332

(22) Filed: Nov. 29, 2013

(65) Prior Publication Data

US 2014/0154828 A1   Jun. 5, 2014

(30) Foreign Application Priority Data

Dec. 4, 2012   (JP) ................................. 2012-265566

(51) Int. Cl.
| | |
|---|---|
| H01L 21/00 | (2006.01) |
| H01L 33/06 | (2010.01) |
| H01L 33/00 | (2010.01) |
| H01L 33/02 | (2010.01) |

(52) U.S. Cl.
CPC .............. *H01L 33/06* (2013.01); *H01L 33/007* (2013.01); *H01L 33/025* (2013.01)

(58) Field of Classification Search
None
See application file for complete search history.

(56) References Cited

U.S. PATENT DOCUMENTS

| | | | |
|---|---|---|---|
| 2005/0056824 A1 | 3/2005 | Bergmann et al. | |
| 2008/0054277 A1* | 3/2008 | Takemi et al. | 257/85 |
| 2012/0248407 A1* | 10/2012 | Toyoda et al. | 257/13 |
| 2013/0256650 A1* | 10/2013 | Yang et al. | 257/43 |

FOREIGN PATENT DOCUMENTS

| | | |
|---|---|---|
| CN | 102738329 A | 10/2012 |
| JP | 11-068159 A | 3/1999 |
| JP | 2010-080619 A | 4/2010 |
| KR | 2012-0017473 A | 2/2012 |
| WO | WO 2006/023060 A2 | 3/2006 |

OTHER PUBLICATIONS

Korean Office Action dated Jan. 30, 2015 with a partial English translation.
TIPO Office Action dated Jun. 5, 2015 with English translation.

* cited by examiner

*Primary Examiner* — Calvin Choi
(74) *Attorney, Agent, or Firm* — McGinn IP Law Group, PLLC

(57) ABSTRACT

The present invention provides a method for producing a Group III nitride semiconductor light-emitting device wherein in the formation of a light-emitting layer by forming a well layer, a capping layer and a barrier layer, the well layer having superior flatness and crystallinity is formed while suppressing the occurrence of damage to the well layer. In formation of the light-emitting layer, pits are provided in the light-emitting layer so that a pit diameter D falls within a range of 120 nm to 250 nm. The light-emitting layer formation step comprises the steps of forming the barrier layer, forming the well layer, and forming the capping layer. The growth temperature of the barrier layer is higher by any temperature in a range of 65° C. to 135° C. than that of the well layer.

12 Claims, 8 Drawing Sheets

METHOD FOR PRODUCING GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device, particularly to a method for a Group III nitride semiconductor light-emitting device having a quantum well structure in which a well layer and a barrier layer are deposited.

2. Background Art

The Group III nitride semiconductor light-emitting device has a light-emitting layer which emits light through recombination of electrons and holes. The light-emitting layer has well layers and barrier layers. The bandgap of the barrier layer is larger than that of the well layer. Some semiconductor light-emitting devices have a multiple quantum well structure (MQW structure) formed by repeatedly depositing the well layer and the barrier layer.

The well layer and the barrier layer are the semiconductor layers having different compositions. Generally, the growth temperature is different between the well layer and the barrier layer. Therefore, in formation of the light-emitting layer having the multiple quantum well structure, the semiconductor layer that has already been formed at a low growth temperature may be damaged when forming a semiconductor layer at a high growth temperature. More specifically, the crystallinity of the semiconductor layer grown at a low temperature may be deteriorated by leaving for a specified time in a high temperature environment. For example, the Indium contained in the well layer is partially evaporated, resulting in uneven composition of the well layer.

Therefore, a protective layer may be provided on the semiconductor layer grown at a low temperature. For example, Japanese Patent Application Laid-Open (kokai) No. H11-68159 discloses the technique of forming a capping layer on the well layer after forming the well layer at a low growth temperature (paragraph [0013] and FIG. 2). This capping layer disappears in the process of temperature rise to form a barrier layer at a high growth temperature (paragraph of [0012] and FIG. 2). Thus, the light-emitting layer can be formed without damaging the well layer.

However, after the capping layer disappeared, the well layer is left directly in a high temperature environment. Therefore, the well layer is not flat or the well layer is damaged in some cases. As a result, the crystallinity of the well layer may be deteriorated. In other words, the light emission efficiency of the semiconductor light-emitting device may be lowered.

SUMMARY OF THE INVENTION

The present invention has been accomplished for solving the aforementioned problems involved in conventional techniques. Accordingly, an object of the present invention is to provide a method for producing a Group III nitride semiconductor light-emitting device in which a well layer having excellent flatness and crystallinity is formed while suppressing the occurrence of damage to the well layer in formation of a light-emitting layer by forming a well layer, a capping layer, and a barrier layer.

Accordingly, in a first aspect of the present invention, there is provided a method for producing a Group III nitride semiconductor light-emitting device, the method is for forming a Group III nitride semiconductor layer on a main surface of a substrate. The method for producing the Group III nitride semiconductor light-emitting device comprises forming a light-emitting layer. Forming the light-emitting layer further comprises the steps of forming a barrier layer, forming a well layer on the barrier layer, and forming a capping layer on the well layer. The substrate temperature in formation of the barrier layer is higher by any temperature in a range of 65° C. to 135° C. than that in formation of the well layer. Then, in formation of the light-emitting layer, a mean pit diameter as measured at the top surface of the light-emitting layer is adjusted to fall within a range of 120 nm to 250 nm.

In the method for producing the Group III nitride semiconductor light-emitting device, a part of the capping layer in the light-emitting layer disappears due to thermal decomposition and diffusion inside the pit. Therefore, damage to the well layer due to disappearance of the capping layer is suppressed. Moreover, the pit dimension after diffusion is adjusted to fall within a certain range. That is, a semiconductor light-emitting device having a well layer with good crystallinity and a pit with an optimum dimension range can be produced.

A second aspect of the present invention is drawn to a specific embodiment of the method for producing the Group III nitride semiconductor light-emitting device, wherein in formation of the light-emitting layer, a mean pit diameter as measured at the bottom surface of the light-emitting layer is adjusted to fall within a range of 50 nm to 170 nm.

A third aspect of the present invention is drawn to a specific embodiment of the method for producing the Group III nitride semiconductor light-emitting device, wherein in formation of the well layer, an Indium-containing layer is formed.

A fourth aspect of the present invention is drawn to a specific embodiment of the method for producing the Group III nitride semiconductor light-emitting device, wherein in formation of the capping layer, a decomposition and diffusion velocity of the capping layer is adjusted to fall within a range of 0.010 Å/sec. to 0.025 Å/sec. Even in this case, a semiconductor light-emitting device having a light-emitting layer in which each semiconductor layer has high flatness and a well layer is less damaged and superior in crystallinity, can be produced.

A fifth aspect of the present invention is drawn to a specific embodiment of the method for producing the Group III nitride semiconductor light-emitting device, wherein in formation of the light-emitting layer, at least 2 Å or more thickness of the capping layer is remained, and the barrier layer is formed on the remaining capping layer. There is no possibility of complete disappearance of the capping layer due to thermal decomposition and diffusion inside the pit during temperature rise when forming the barrier layer. Therefore, there is almost no possibility of damage to the well layer.

A sixth aspect of the present invention is drawn to a specific embodiment of the method for producing the Group III nitride semiconductor light-emitting device, wherein in formation of the light-emitting layer, a total thickness of the light-emitting layer is adjusted to fall within a range of 500 nm to 700 nm. This is because the pit having a preferred pit diameter is easily formed.

The present invention enables provision of a method for producing the Group III nitride semiconductor light-emitting device in which the well layer having superior flatness and crystallinity is formed while suppressing the occurrence of damage to the well layer in formation of the light-emitting layer by forming the well layer, the capping layer, and the barrier layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
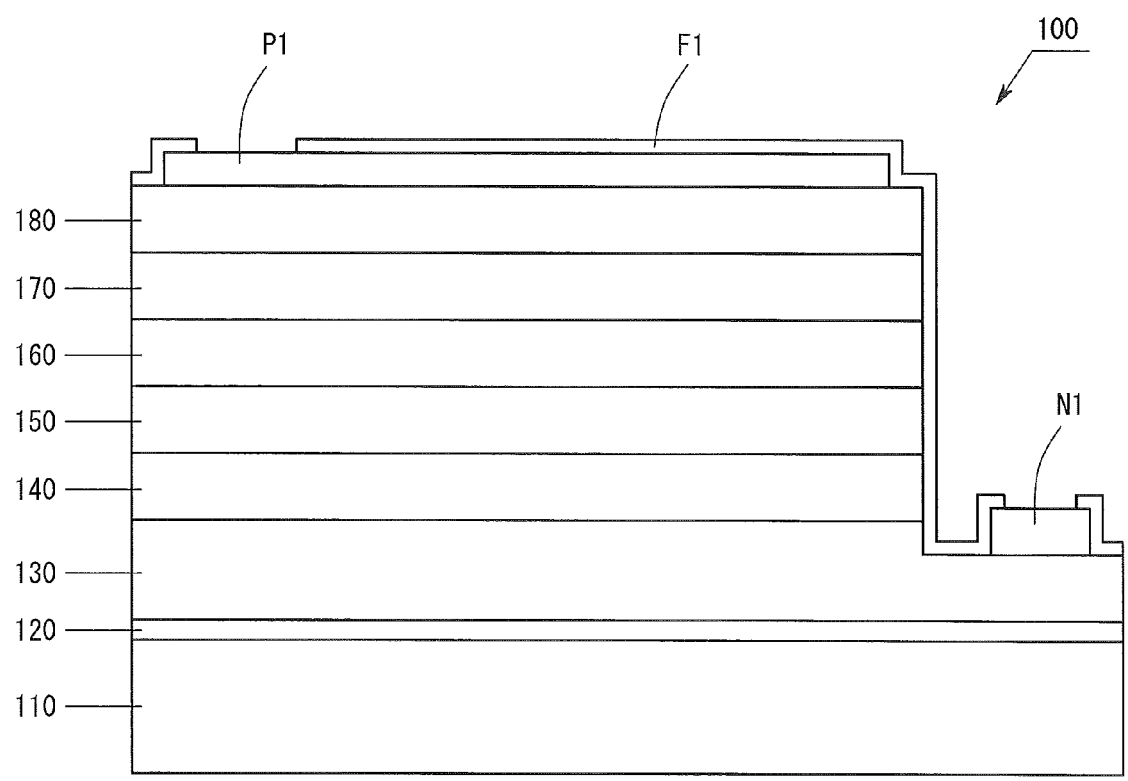
FIG. 1 is a schematic view of the structure of a Group III nitride semiconductor light-emitting device according to an embodiment.

Specific embodiments of the present invention will next be described with reference to the drawings by taking, as an example, the case where a semiconductor light-emitting device is produced. However, the present invention is not limited to the embodiments. Needless to say, the structures of the layers and electrodes forming the below-mentioned light-emitting devices are merely examples, and may differ from those exemplified in the below-described embodiments. The thickness of each layer, which is schematically shown in the drawings, does not correspond to its actual value. Also, the dimensions of the pits described later are larger than the actual values.

1. Semiconductor Light-Emitting Device

Figure 2:
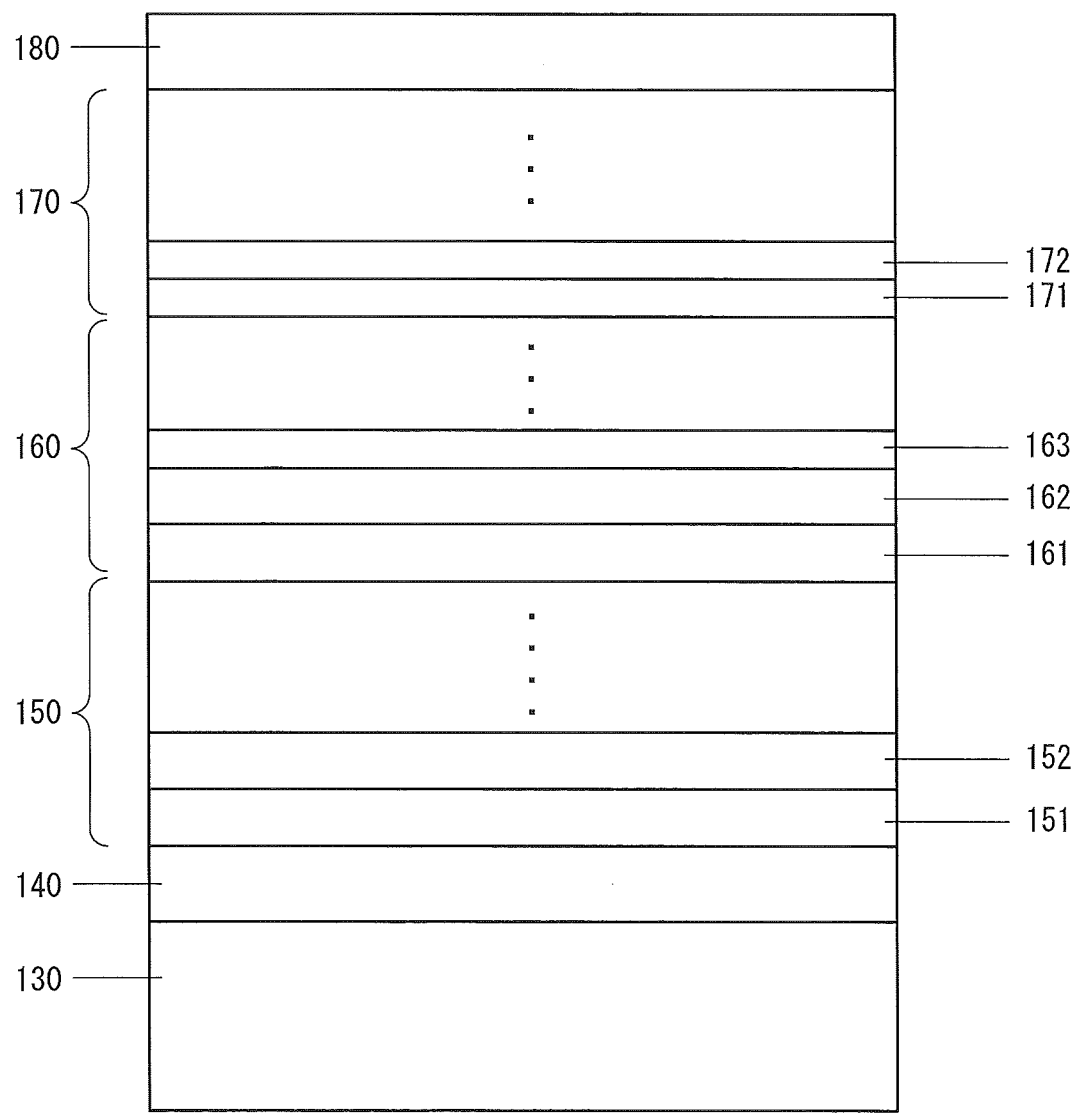
FIG. 2 is a schematic view of the layer structure of the semiconductor layers forming the Group III nitride semiconductor light-emitting device according to the embodiment.

FIG. 1 is a schematic view of the structure of a Group III nitride semiconductor light-emitting device 100 according to the present embodiment. FIG. 2 is a schematic view of the layer structure of the semiconductor layers forming the Group III nitride semiconductor light-emitting device 100. The light-emitting device 100 is a face-up-type semiconductor light-emitting device. The light-emitting device 100 has a plurality of semiconductor layers formed of a Group III nitride semiconductor.

As shown in FIG. 1, the light-emitting device 100 has a substrate 110, a low-temperature buffer layer 120, an n-type contact layer 130, an n-type ESD layer 140, an n-type SL layer 150, a light-emitting layer 160, a p-type cladding layer 170, a p-type contact layer 180, an n-type electrode N1, a p-type electrode P1, and a passivation film F1.

On the main surface of the substrate 110, semiconductor layers are formed; i.e., the low-temperature buffer layer 120, the n-type contact layer 130, the n-type ESD layer 140, the n-type SL layer 150, the light-emitting layer 160, the p-type cladding layer 170, and the p-type contact layer 180, in this order. The n-type electrode N1 is formed on the n-type contact layer 130, and the p-type electrode P1 is formed on the p-type contact layer 180.

The substrate 110 serves as a growth substrate having the main surface on which the semiconductor layers are formed through MOCVD. The surface of the substrate 110 may be embossed having concaves and convexes. The substrate 110 is made of sapphire. Other than sapphire, materials such as SiC, ZnO, Si, and GaN may be used.

The low-temperature buffer layer 120 is employed so as to form a layer thereon while maintaining the crystal structure of the substrate 110. Therefore, the low-temperature buffer layer 120 is formed on the main surface of the substrate 110. The low-temperature buffer layer 120 is made of a material such as AlN or GaN.

The n-type contact layer 130 is employed so as to be in ohmic contact with the n-type electrode N1. The n-type contact layer 130 is formed on the low-temperature buffer layer 120. The n-type contact layer 130 is located beneath the n-type electrode N1. The n-type contact layer 130 is an n-type GaN layer having an Si concentration of $1 \times 10^{18}/cm^3$ or higher. The n-type contact layer 130 may be formed of a plurality of layers having different carrier concentrations, for the purpose of enhancement of ohmic contact with the n-type electrode N1. The thickness of the n-type contact layer 130 is, for example, 4 μm. Needless to say, other thickness values may be employed.

The n-type ESD layer 140 serves as an electrostatic-breakdown-voltage-improving layer for preventing electrostatic breakdown of each semiconductor layer. The n-type ESD layer 140 is formed on the n-type contact layer 130. The n-type ESD layer 140 is a semiconductor layer formed by depositing non-doped i-GaN and n-type GaN. The n-type ESD layer 140 has a thickness of 300 nm.

The n-type SL layer 150 serves as a strain-relaxing layer for relaxing the stress applied to the light-emitting layer 160. More specifically, the n-type SL layer 150 is an n-type superlattice layer having a superlattice structure. The n-type SL layer 150 is formed on the n-type ESD layer 140. As shown in FIG. 2, the n-type SL layer 150 is formed by repeatedly depositing layer units each being formed of an InGaN layer 151 and an n-type GaN layer 152. The number of repetitions is 10 to 20. However, the number may fall outside the range.

The light-emitting layer 160 emits light through recombination of electrons and holes. The light-emitting layer 160 is formed on the n-type SL layer 150. The light-emitting layer 160 is formed by repeatedly depositing layer units each being formed of a barrier layer 161, a well layer 162, and a capping layer 163. That is, the light-emitting layer 160 has a multiple quantum well structure (MQW structure) in which the layer units are repeatedly deposited. The capping layer 163 serves as a protective layer for protecting the well layer 162 from heat, e.g. playing a role to prevent indium sublimation from the well layer 162. For example, the number of repetitions is 5. However, the number may fall outside the range. The barrier layer 161 is, e.g., a GaN layer or an AlGaN layer. The well layer 162 is, e.g., an InGaN layer. The capping layer 163 is, e.g., a GaN layer. These are merely examples. However, the well layer 162 is an Indium-containing layer.

The thickness of the barrier layer 161 is 10 Å to 100 Å. The well layer 162 has a thickness of 10 Å to 50 Å. The capping layer 163 has a thickness of 2 Å to 18 Å. These values are merely examples. Other range may be employed as long as the thickness of the capping layer 163 is at least 2 Å or more.

The total thickness of the light-emitting layer 160 is 500 nm to 700 nm.

The p-type cladding layer 170 is formed on the light-emitting layer 160. As shown in FIG. 2, the p-type cladding layer 170 is formed by repeatedly depositing a p-type InGaN layer 171 and a p-type AlGaN layer 172. For example, the number of repetitions is 5. The p-type InGaN layer 171 has an In compositional ratio from 0.05 to 0.12. The p-type InGaN layer 171 has a thickness of 2 nm. The p-type AlGaN layer 172 has an Al compositional ratio from 0.25 to 0.4. The p-type AlGaN layer 172 has a thickness of 2.5 nm. These values are merely examples, and other values may be employed. Alternatively, other structure may be employed.

The p-type contact layer 180 is formed on the p-type cladding layer 170. The p-type contact layer 180 is provided so as to establish ohmic contact with the p-type electrode P1. The p-type contact layer 180 has a thickness of 80 nm. The p-type contact layer 180 is doped with Mg at an Mg concentration from $1\times10^{19}/cm^3$ to $1\times10^{22}/cm^3$.

The p-type electrode P1 is formed on the p-type contact layer 180. The p-type electrode P1 is in ohmic contact with the p-type contact layer 180. The p-type electrode P1 is made of ITO.

The n-type electrode N1 is formed on the n-type contact layer 130. The n-type electrode N1 is in ohmic contact with the n-type contact layer 130. The n-type electrode N1 is formed by sequentially forming V film and Al film on the n-type contact layer 130. Alternatively, the n-type electrode N1 may be formed by sequentially forming Ti film and Al film. However, the film is not limited to these.

The passivation film F1 covers the side surfaces of the n-type contact layer 130, the n-type ESD layer 140, the n-type SL layer 150, the light-emitting layer 160, the p-type cladding layer 170, and the p-type contact layer 180, and portions of the p-type electrode P1 and the n-type electrode N1. In other words, the remaining portions of the p-type electrode P1 and the n-type electrode N1 are not covered with the passivation film F1 and are exposed. The passivation film F1 is made of, for example, $SiO_2$.

2. Pit Shape

Figure 3:
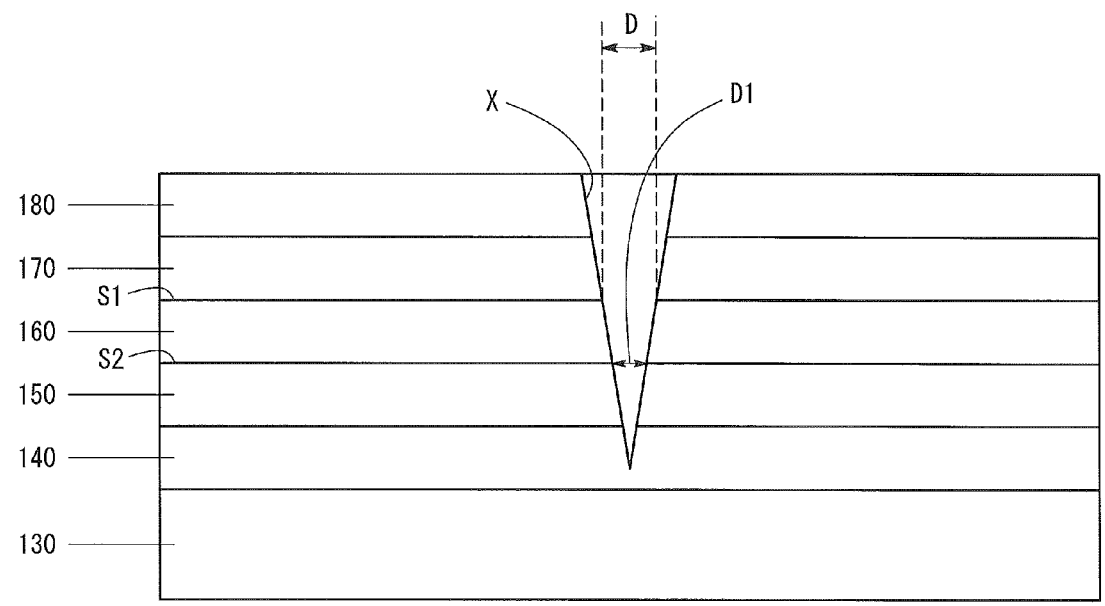
FIG. 3 is a schematic view of the shape of a pit provided in the Group III nitride semiconductor light-emitting device according to the embodiment.

FIG. 3 shows a pit X provided in the light-emitting device 100. In FIG. 3, only the semiconductor of the light-emitting device 100 is drawn. The pit X is generated at the threading dislocation. The pit X is started to grow in the n-type ESD layer 140. That is, the threading dislocation growing upward on the substrate 110 propagates in a lateral direction, i.e., in a direction orthogonal to the threading dislocation growth direction in the film inside of the n-type ESD layer 140. Thus, the pit X is formed. Then, the pit X grows until it reaches the p-type contact layer 180.

FIG. 3 shows the pit diameter D of the pit X. The pit diameter D in the present embodiment is a mean diameter of all pits X as measured at the top surface of the light-emitting layer 160; i.e., at the interface S1 between the light-emitting layer 160 and the p-type cladding layer 170.

The pit diameter D of the pit X varies in accordance with the thickness of the n-type ESD layer 140 and with the temperature at which the n-type ESD layer 140 is grown. As the thickness of the n-type ESD layer 140 increases, the pit diameter D increases. In contrast, as the thickness of the n-type ESD layer 140 decreases, the pit diameter D decreases. Also, as the n-type ESD layer 140 growth temperature is elevated, the pit diameter D decreases. In contrast, as the n-type ESD layer 140 growth temperature is lowered, the pit diameter D increases. Thus, the pit diameter D can be regulated through modifying the thickness and the growth temperature of the n-type ESD layer 140. Even in formation of a semiconductor layer on or above the n-type ESD layer, the relationship between the thickness or the growth temperature of the semiconductor layer and the pit diameter D is the same.

In the present embodiment, the pit diameter D satisfies the following Eq. 1:

$$120 \text{ nm} \leq D \leq 250 \text{ nm} \qquad (1)$$

That is, the pit diameter D is 120 nm to 250 nm. The Eq. 1 will be described in detail in the below-described experiment section.

FIG. 3 shows the diameter D1 of the pit X of the n-type SL layer 150. The diameter D1 of the pit X of the n-type SL layer 150 is the mean diameter of all pits X as measured at the bottom surface of the light-emitting layer 160. That is, the diameter D1 of the pit X is the mean diameter of all pits X as measured at the boundary S2 between the n-type SL layer 150 and the light-emitting layer 160.

3. Growth Temperature of Light-Emitting Layer

In the present embodiment, the difference in the substrate temperature between when forming the barrier layer 161 and when forming the well layer 162 satisfies the following Eq. 2:

$$65° C. \leq \Delta T \leq 135° C.$$

$$\Delta T = T1 - T2 \qquad (2)$$

ΔT: Growth temperature difference
T1: Growth temperature of barrier layer
T2: Growth temperature of well layer In other words, the substrate temperature when forming the barrier layer 161 is higher by 65° C. to 135° C. than that when forming the well layer 162. Here, T1 is the growth temperature of the barrier layer 161, i.e., the substrate temperature when forming the barrier layer 161. T2 is the growth temperature of the well layer 162, i.e., the substrate temperature when forming the well layer 162. ΔT is the growth temperature difference between the barrier layer 161 and the well layer 162, i.e., the difference between the substrate temperature when forming the barrier layer 161 and the substrate temperature when forming the well layer 162.

4. Method for Producing Semiconductor Light-Emitting Device

The method for producing the light-emitting device 100 according to the present embodiment will be described. The aforementioned respective semiconductor layers are formed through epitaxial crystal growth by metal-organic chemical vapor deposition (MOCVD). The carrier gas employed in the method is hydrogen ($H_2$), nitrogen ($N_2$), or a gas mixture of hydrogen and nitrogen ($H_2+N_2$). Ammonia gas ($NH_3$) is employed as a nitrogen source. Trimethylgallium ($Ga(CH_3)_3$) is employed as a Ga source. Trimethylindium ($In(CH_3)_3$) is employed as an In source. Trimethylaluminum ($Al(CH_3)_3$) is employed as an Al source. Silane ($SiH_4$) is employed as an n-type dopant gas. Cyclopentadienylmagnesium ($Mg(C_5H_5)_2$) is employed as a p-type dopant gas.

4-1. n-Type Contact Layer Formation Step

Firstly, the low-temperature buffer layer 120 is formed on the main surface of the substrate 110. On the buffer layer 120, the n-type contact layer 130 is formed. The substrate temperature in this step is adjusted to 1,080° C. to 1,140° C. The Si concentration is $1\times10^{18}/cm^3$ or higher.

4-2. Electrostatic-Breakdown-Voltage-Improving Layer Formation Step

Figure 4:
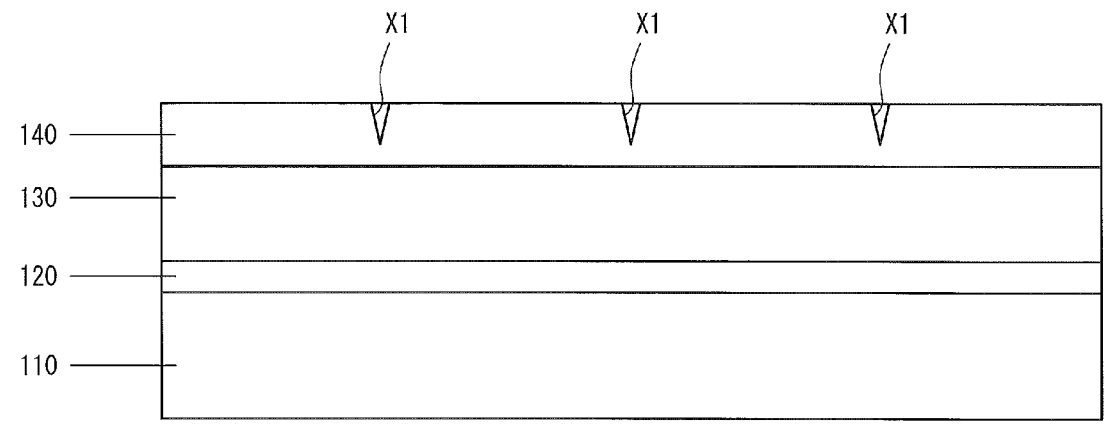
FIG. 4 is a schematic view illustrating a method for producing the Group III nitride semiconductor light-emitting device according to the embodiment (part 1)

Then, the n-type ESD layer 140 is formed on the n-type contact layer 130. In this step, feed of silane ($SiH_4$) is stopped, and i-GaN is formed. Thereafter, silane ($SiH_4$) is fed again, and the n-type GaN layer is formed. The substrate temperature is adjusted to fall within a range of 750° C. to 950° C. As shown in FIG. 4, pits X1 are provided in this step. As the growth of the semiconductor layer proceeds, the pit X1 grows into the pit X. In this way, the n-type ESD layer 140 is formed while forming the pits X1.

4-3. n-Type Superlattice Layer Formation Step

Then, the n-type SL layer 150 is formed. Firstly, the InGaN layer 151 is formed on the n-type ESD layer 140, and then the n-type GaN layer 152 is formed on the InGaN layer 151. Then, the combination of InGaN layer 151 and n-type GaN layer 152 is employed as a layer unit, and the unit is repeatedly formed.

4-4. Light-Emitting Layer Formation Step

Subsequently, the light-emitting layer 160 is formed by repeatedly depositing layer units each layer unit being formed of the barrier layer 161, the well layer 162, and the capping layer 163 deposited in this order. In other words, the light-emitting layer formation step comprises the steps of forming the barrier layer 161, forming the well layer 162 on the barrier layer 161, and forming the capping layer 163 on the well layer 162. These steps are repeatedly performed. Therefore, the barrier layer 161 is formed again on the capping layer 163.

The difference between the growth temperature of the barrier layer 161 and the growth temperature of the well layer 162 satisfies Eq. 2. That is, the substrate temperature in formation of the barrier layer is higher by 65° C. to 135° C. than the substrate temperature in formation of the well layer. The substrate temperature when growing the well layer 162 is adjusted to fall within a range of 730° C. to 850° C.

Moreover, the growth temperature in formation of the barrier layer is higher than that in formation of the capping layer. Therefore, in formation of the barrier layer, the substrate temperature is elevated until the substrate temperature reaches the growth temperature of the barrier layer 161. This temperature elevation causes a part of the capping layer 163 to disappear due to thermal decomposition and diffusion inside the pit X.

When forming the barrier layer 161 again, the capping layer 163 is not completely disappeared. At least 2 Å or more thickness of the capping layer 163 is remained. This can prevent Indium from sublimating from the well layer 162 and from being separated from the semiconductor layer. The remaining capping layer 163 partially fills in the inside of the pit X. Therefore, the surface of the capping layer 163 is flat. The barrier layer 161 is formed again on the remaining capping layer 163.

The total thickness of the light-emitting layer 160 is adjusted to fall within a range of 500 nm to 700 nm. This is because the pit X can be easily formed when the pit diameter D satisfies Eq. 1. Then, the light-emitting layer 160 is formed by adjusting the pit diameter D at the top surface of the light-emitting layer 160 to fall within a range of 120 nm to 250 nm.

4-5. p-Type Superlattice Layer Formation Step

Then, the p-type cladding layer 170 is formed by repeatedly depositing the p-type InGaN layer 171 and the p-type AlGaN layer 172.

4-6. p-Type Contact Layer Formation Step

Figure 5:
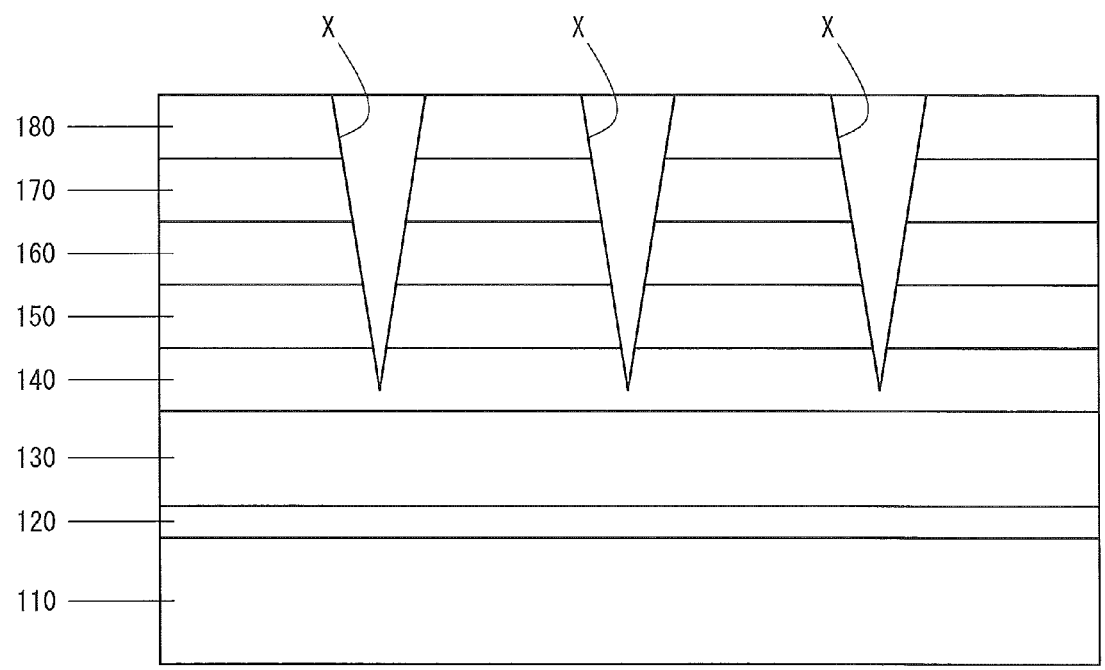
FIG. 5 is a schematic view illustrating the method for producing the Group III nitride semiconductor light-emitting device according to the embodiment (part 2)

Then, the p-type contact layer 180 is formed. The substrate temperature is adjusted to fall within a range of 900° C. to 1050° C. As a result, as shown in FIG. 5, semiconductor layers are deposited on the substrate 110. At this time, the pit X is formed so as to cover the area from the n-type ESD layer 140 up to the p-type contact layer 180.

4-7. Electrode Formation Step

Then, the p-type electrode P1 is formed on the p-type contact layer 180. The semiconductor layer deposited structure is partially removed through laser radiation or etching from the p-type contact layer 180, to thereby expose the n-type contact layer 130. The n-type electrode N1 is formed on the exposed area of the n-type contact layer 130. Formation of the p-type electrode P1 and formation of the n-type electrode N1 may be carried out in any order.

4-8. Insulating Film Formation Step

Then, side surfaces of the semiconductor layers, a part of p-type electrode P1, and a part of n-type electrode N1 are covered with the passivation film F1. Although an example of the passivation film F1 is an $SiO_2$ film, other transparent insulating films may be employed. In an alternative procedure, the entirety of the light-emitting device 100 is covered with the passivation film F1, and then portions of interest are exposed.

4-9. Other Steps

In addition to the aforementioned steps, thermal treatment and other steps may be performed. Through carrying out the steps, production of the light-emitting device 100 shown in FIG. 1 is complete.

5. Experiments 5-1. Pit Diameter and Light Output

The relationship between the pit X formed on the light-emitting device 100 and the light output of the semiconductor light-emitting device was investigated. The experiments performed for the investigation will be described in detail. In this experiment, as shown in Table 1, an AlGaN layer was formed as the barrier layer of the light emitting layer, an InGaN layer was formed as the well layer of the light emitting layer, and a GaN layer was formed as the capping layer of the light emitting layer. The Al compositional ratio of the barrier layer was 0.05. The In compositional ratio of the well layer was 0.2. The growth temperature of the barrier layer was 900° C., and the growth temperatures of the well layer and the capping layer were 800° C. The total thickness of the light emitting layer formed by repeatedly depositing the above layers was adjusted to 600 nm.

5-1-1. Top Surface of Light-Emitting Layer

Figure 6:
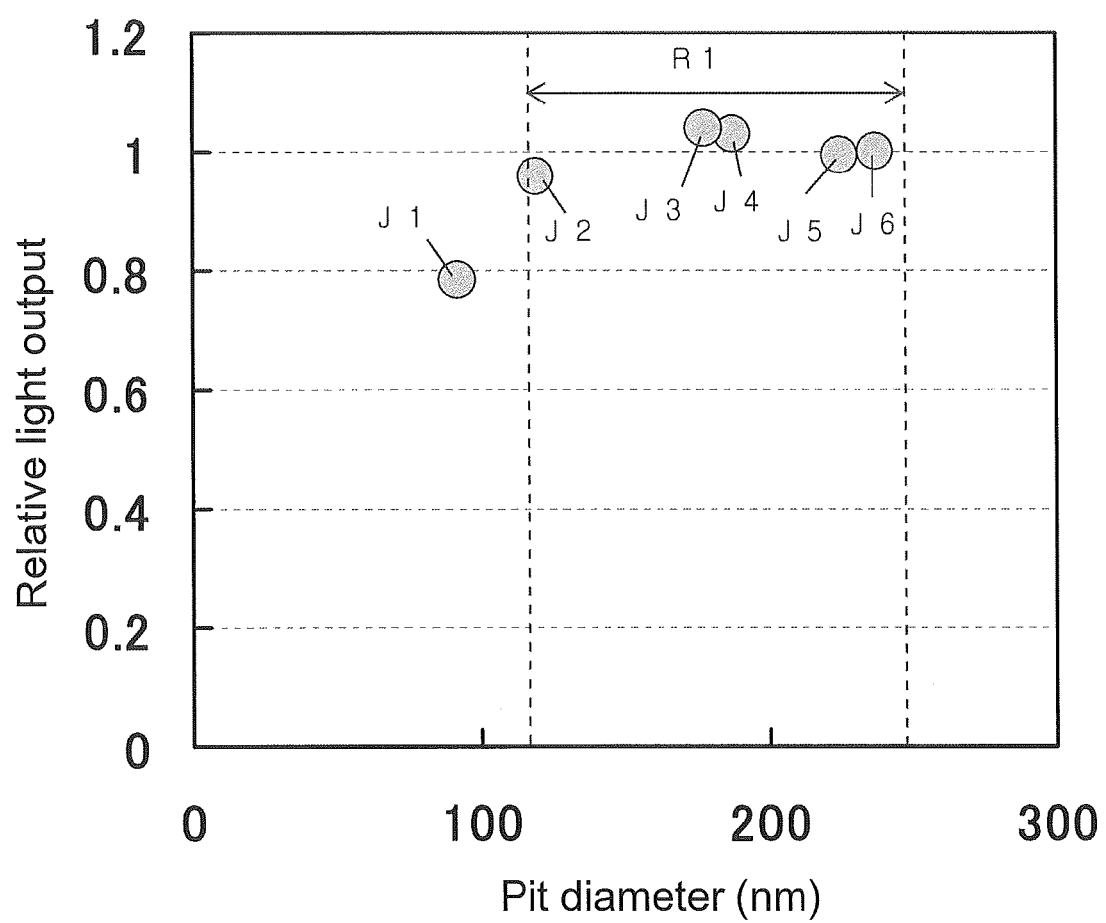
FIG. 6 is a graph showing the relationship between the pit diameter at the top surface of the light-emitting layer and the relative light output of the light-emitting device.

FIG. 6 is a graph showing the relationship between the pit diameter D of the light-emitting layer 160 and the relative light output of the semiconductor light-emitting device. In FIG. 6, the light output of the semiconductor light-emitting device when the pit diameter D is 250 nm was set as the reference value, i.e., 1. When the pit diameter D is a value other than the reference value, the light output value relative to the reference value was plotted.

As shown in FIG. 6, in the range of region R1, the relative light output value falls within ±5% of the reference value. The region R1 is the range satisfying Eq. 1. That is, within the range of the pit diameter D satisfying Eq. 1, the light output of the semiconductor light-emitting device is sufficient.

The data points are labeled as J1, J2, J3, J4, J5, and J6 from the left of the graph shown in FIG. 6, i.e., in ascending order of the pit diameter D.

5-1-2. Bottom Surface of Light-Emitting Layer

Figure 7:
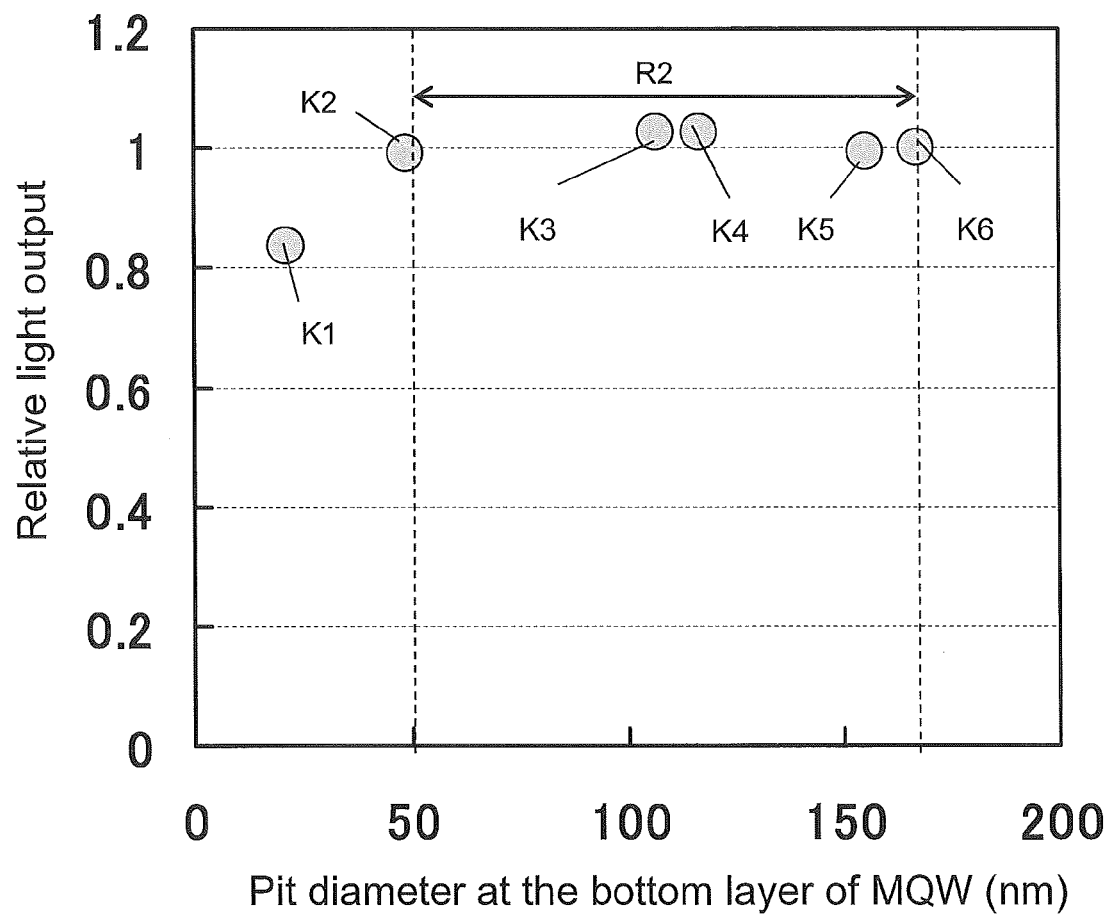
FIG. 7 is a graph showing the relationship between the pit diameter at the bottom surface of the light-emitting layer and the relative light output of the light-emitting device.

FIG. 7 shows the relationship between the diameter D1 of the pit X as measured at the bottom surface S2 of the light-emitting layer 160 and the relative light output of the semiconductor light-emitting device. In FIG. 7, the light output of the semiconductor light-emitting device when the diameter D1 of the pit X is 170 nm was set as the reference value, i.e., 1. When the pit diameter D1 is a value other than the reference value, the light output value relative to the reference value was plotted.

As shown in FIG. 7, in the range of region R2, the relative light output value falls within ±5% of the reference value. The mean diameter D1 of all pits X as measured at the bottom surface S2 of the light-emitting layer 160 falls within the range that satisfying the following Eq. 3 (within the range of region R2 in FIG. 7):

$$50\ nm \le D1 \le 170\ nm \tag{3}$$

That is, the light-emitting layer 160 is preferably formed by adjusting the mean diameter D1 of all pits X as measured at the bottom surface S2 of the light-emitting layer 160 to fall within a range of 50 nm to 170 nm.

The data points are labeled as K1, K2, K3, K4, K5, and K6 from the left of the graph shown in FIG. 7, i.e., in ascending order of the pit diameter D1.

Figure 8:
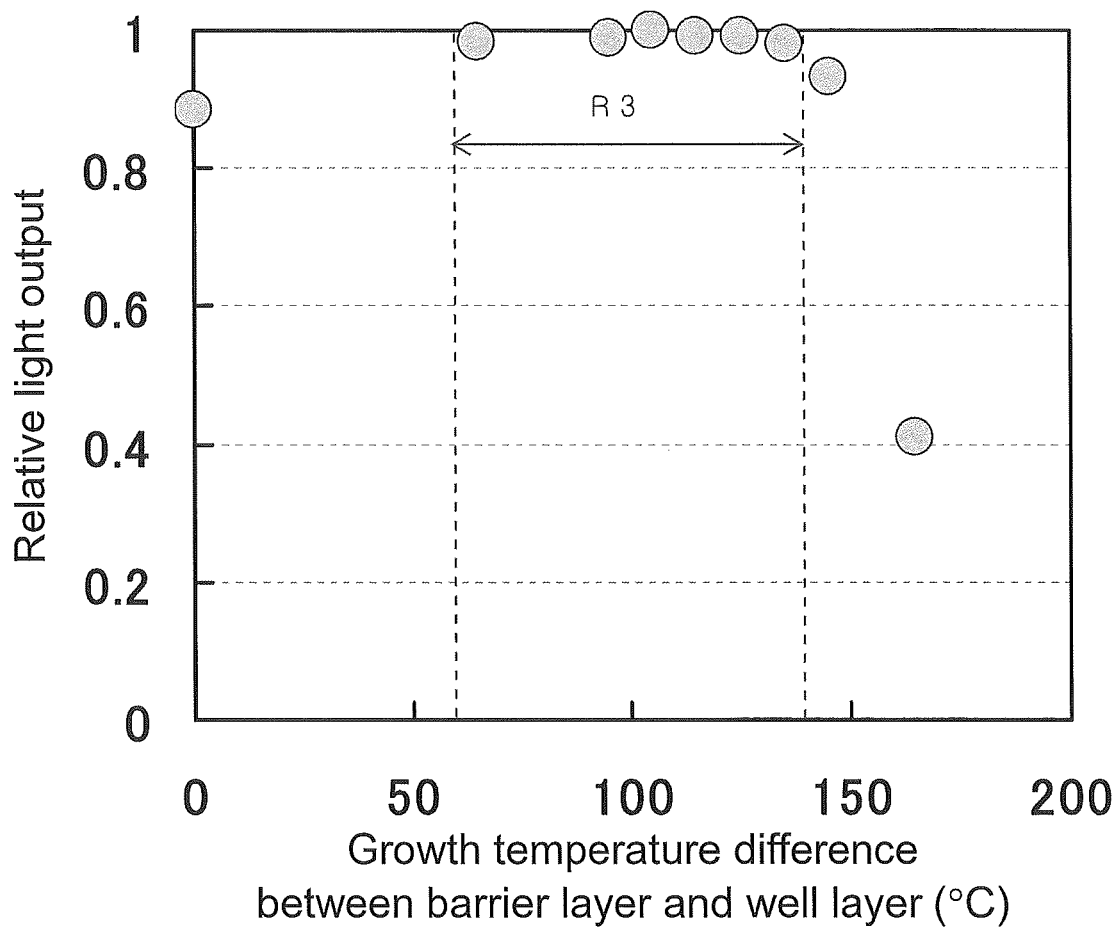
FIG. 8 is a graph showing the relationship between the difference in the growth temperature of the well layer and the barrier layer and the relative light output of the light-emitting device.

5-2. Growth Temperature Difference Between Well Layer and Barrier Layer and Light Output FIG. 8 is a graph showing the relationship between the difference in the growth temperature of the barrier layer 161 and the well layer 162 and the relative output of the light-emitting device. In FIG. 8, the light output value when the difference in the growth temperature of the barrier layer 161 and the well layer 162 is 100° C. was set as the reference value, i.e., 1. Table 1 shows the growth temperatures of layers in the semiconductor light-emitting device when the reference value is set.

As shown in FIG. 8, in the range of region R3, the relative light output value falls within ±5% of the reference value. The region R3 is the range satisfying the aforementioned Eq. 2.

TABLE 1

| | Material | Compositional ratio | Growth temperature |
|---|---|---|---|
| Capping layer | GaN | — | 800° C. |
| Well layer | InGaN | 0.2 (In) | 800° C. |
| Barrier layer | AlGaN | 0.05 (Al) | 900° C. |

5-3. Decomposition and Diffusion Velocity of Capping Layer

Figure 9:
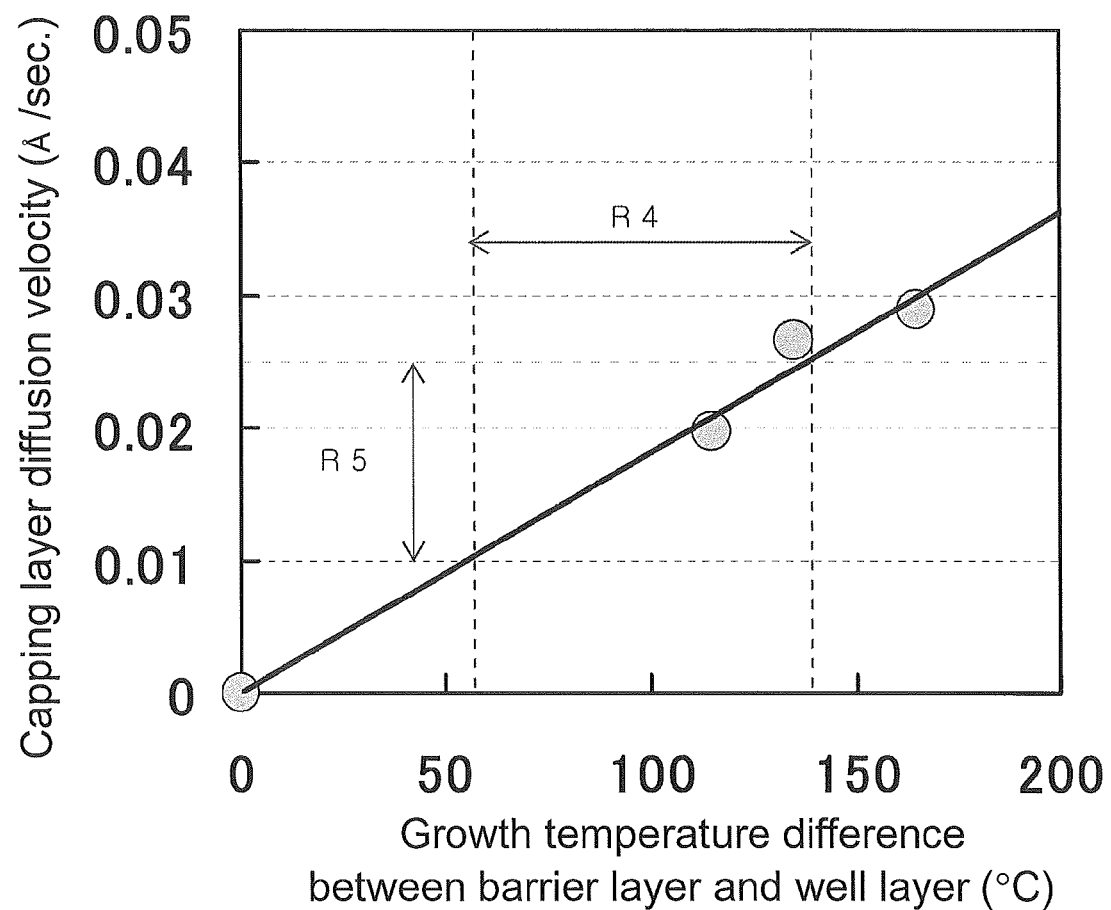
FIG. 9 is a graph showing the relationship between the difference in the growth temperature of the well layer and the barrier layer and the decomposition and diffusion velocity of the capping layer.

FIG. 9 is a graph showing the relationship between the difference in the growth temperature of the barrier layer 161 and the well layer 162 and the decomposition and diffusion velocity of the capping layer 163. As shown in FIG. 9, as the difference in the growth temperature of the barrier layer 161 and the well layer 162 increases, the decomposition and diffusion velocity of the capping layer 163 increases. When there is no difference in the growth temperature of the barrier layer 161 and the well layer 162, the capping layer 163 does not diffuse.

As used herein, the term "decomposition and diffusion velocity" refers to the disappearance velocity of the capping layer 163 obtained by adding the disappearing component of the capping layer 163 due to thermal decomposition during temperature rise and the component penetrating into the pit X of the capping layer 163. When the decomposition and diffusion velocity V of the capping layer 163 satisfies the following Eq. 4, the difference in the growth temperature of the barrier layer 161 and the well layer 162 satisfies Eq. 2.

$$0.010\ \text{Å/sec.} \le V \le 0.025\ \text{Å/sec.} \tag{4}$$

V: Decomposition and diffusion velocity of capping layer 163

The decomposition and diffusion velocity due to temperature rise from formation of the capping layer to formation of the barrier layer may be adjusted to fall within a range of 0.010 Å/sec. to 0.025 Å/sec. Therefore, when Eq. 4 is satisfied, the light output of the semiconductor light-emitting device is high. The region R4 of FIG. 9 is the range satisfying Eq. 2. The region R5 is the range satisfying Eq. 4.

Thus, a part of the capping layer 163 is decomposed and the remaining capping layer 163 drifts into the pit X by temperature rise from formation of the capping layer to formation of the barrier layer. Since the capping layer 163 disappears instead of the well layer 162, almost no damage is given to the well layer 162. The remaining capping layer 163 suitably fills in the pit X. Therefore, the flat well layer 162 can be formed, i.e., the light-emitting layer 160 with superior crystallinity can be formed.

When the well layer 162 of the light-emitting layer 160 has an In compositional ratio X satisfying $0 < X \le 0.4$, the present invention can be applied.

6. Modifications 6-1. Light-Emitting Layer

In the present embodiment, an AlGaN layer was used as the barrier layer 161 of the light-emitting layer 160, an InGaN layer was used as the well layer 162, and a GaN layer was used as the capping layer 163. However, an AlInGaN layer may be used as the well layer 162. Moreover, any one of InGaN layer, AlGaN layer, and AlInGaN layer may be used as the barrier layer 161 and the capping layer 163. However, the well layer 162 of the light-emitting layer 160 has the smallest bandgap. The barrier layer 161 and the capping layer 163 may be made of different materials.

6-2. p-Electrode

In the aforementioned embodiment, the p-type electrode P1 was formed of ITO, which is a transparent conductive oxide. However, other than ITO, transparent conductive oxides such as ICO, IZO, ZnO, $TiO_2$, $NbTiO_2$, and $TaTiO_2$ may also be used. A metal electrode made of a metallic material may be provided on the p-type electrode P1. Alternatively, another electrode may be provided on the p-type electrode P1.

6-3. Combinations

The aforementioned modifications may be employed in any combination.

7. Summary of the Present Embodiment

As described hereinabove, in the light-emitting device 100 of the present embodiment, the pit diameter D as measured at the top surface S1 of the light-emitting layer 160 is 120 nm to 250 nm. The growth temperature of the barrier layer 161 is higher by any temperature in a range of 65° C. to 135° C. than that of the well layer 162. Therefore, the light-emitting device 100 having a flat well layer in the light-emitting layer 160 and having high crystallinity can be provided.

Since the aforementioned embodiments are merely examples, it should be understood that those skilled in the art can perform various variations and modifications, without deviating the scope of the present invention. The deposit structure of the deposited body is not necessarily limited to those illustrated. The deposit structure, the number of repetitions of the layers, etc. may be determined. The layer formation method is not limited to metal-organic chemical vapor deposition (MOCVD), and any other methods may be employed, so long as the semiconductor crystal growth is performed by use of a carrier gas. That is, semiconductor layers may be formed through liquid-phase epitaxy, molecular-beam epitaxy, or another epitaxial growth technique.

What is claimed is:

1. A method for producing a Group III nitride semiconductor light-emitting device including a Group III nitride semiconductor layer on a main surface of a substrate, the method comprising:
   forming a light-emitting layer, comprising:
      forming a barrier layer comprising AlGaN;
      forming a well layer comprising InGaN on the barrier layer; and
      forming a capping layer comprising GaN with a thickness in a range from 2 Å to 18 Å on the well layer;

wherein a substrate temperature in formation of the barrier layer is higher by any temperature in a range from 65° C. to 135° C. than a substrate temperature in formation of the well layer, wherein, in formation of the light-emitting layer, a mean pit diameter as measured at a bottom surface of the light-emitting layer is adjusted to fall within a range of 50 nm to 170 nm, and wherein, in the formation of the light-emitting layer, a mean pit diameter as measured at a top surface of the light-emitting layer is adjusted to fall within a range of 120 nm to 250 nm by partially filling in an inside of a pit with the capping layer during temperature rise when forming the barrier layer.

2. The method for producing a Group III nitride semiconductor light-emitting device according to claim 1, wherein, in formation of the capping layer, a decomposition and diffusion velocity of the capping layer is adjusted to fall within a range of 0.010 Å/sec. to 0.025 Å/sec.

3. The method for producing a Group III nitride semiconductor light-emitting device according to claim 1, wherein, in the formation of the light-emitting layer, at least 2 Å or more thickness of the capping layer is remained, and the barrier layer is formed on a remaining capping layer.

4. The method for producing a Group III nitride semiconductor light-emitting device according to claim 2, wherein, in the formation of the light-emitting layer, at least 2 Å or more thickness of the capping layer is remained, and the barrier layer is formed on a remaining capping layer.

5. The method for producing a Group III nitride semiconductor light-emitting device according to claim 1, wherein, in the formation of the light-emitting layer, a total thickness of the light-emitting layer is adjusted to fall within a range of 500 nm to 700 nm.

6. The method for producing a Group III nitride semiconductor light-emitting device according to claim 2, wherein, in the formation of the light-emitting layer, a total thickness of the light-emitting layer is adjusted to fall within a range of 500 nm to 700 nm.

7. The method for producing a Group III nitride semiconductor light-emitting device according to claim 1, wherein the light-emitting layer includes a multiple quantum well (MQW) structure.

8. The method for producing a Group III nitride semiconductor light-emitting device according to claim 7, wherein forming the MQW structure includes repeatedly depositing layer units each including the barrier layer, the well layer, and the capping layer deposited in this order.

9. The method for producing a Group III nitride semiconductor light-emitting device according to claim 1, wherein the light-emitting layer is formed by repeatedly depositing layer units each including the barrier layer, the well layer, and the capping layer deposited in this order.

10. The method for producing a Group III nitride semiconductor light-emitting device according to claim 1, wherein the capping layer is configured as a protective layer for protecting the well layer from heat.

11. The method for producing a Group III nitride semiconductor light-emitting device according to claim 1, wherein a thickness of the barrier layer is in a range from 10 Å to 100 Å.

12. The method for producing a Group III nitride semiconductor light-emitting device according to claim 11, wherein a thickness of the well layer is in a range of 10 Å to 50 Å.

* * * * *